United States Patent [19]
de Cremoux

[11] 3,959,646
[45] May 25, 1976

[54] AVALANCHE PHOTO-DIODES

[75] Inventor: Baudouin de Cremoux, Paris, France

[73] Assignee: Thomson-CSF, Paris, France

[22] Filed: Nov. 25, 1974

[21] Appl. No.: 526,929

[30] Foreign Application Priority Data
Nov. 28, 1973 France .................. 73.42292

[52] U.S. Cl. .................. 250/211 J; 357/13; 357/30
[51] Int. Cl.² .................. H01L 27/14
[58] Field of Search .................. 357/30, 13, 19; 250/211 J

[56] References Cited
UNITED STATES PATENTS

| 3,296,502 | 1/1967 | Gross et al. | 357/30 |
| 3,452,206 | 6/1969 | Biet et al. | 250/211 J |
| 3,534,231 | 10/1970 | Biard | 357/13 |

OTHER PUBLICATIONS

D'Asaro et al., Electronics, Vol. 39, No. 11, 5/30/66, pp. 94–98.

Primary Examiner—Walter Stolwein
Attorney, Agent, or Firm—Cushman, Darby & Cushman

[57] ABSTRACT

An avalanche photodiode whose avalanche voltage is relatively low, comprises a detector region, which is p-type doped to sufficiently small depth at its central region in order for the reverse voltage applied across its terminals to develop a field strength in the order of the avalanche field strength there.

7 Claims, 6 Drawing Figures

AVALANCHE PHOTO-DIODES

The present invention relates to a photodetector diode for telecommunication systems employing optical fibres.

It is well known in this context to utilise p-n junction avalanche photodiodes made of germanium or silicon. These diodes have the following drawbacks:

their avalanche voltage is of the order of 200 volts or they have a poor power ratio at the wavelength of 0.80 microns which is the one more particularly used in telecommunications.

The object of the present invention is an avalanche photodiode which does not exhibit these drawbacks.

The avalanche photo-diode in accordance with the invention is of the kind which possesses a heterojunction, one of the junction elements being made of a material transparent to the radiation which is to be detected and amplified, the other element being opaque to said radiation and being submitted to the avalanche phenonemon. It is characterized essentially in that the first element comprises a central portion and a peripheral portion having a geometric configuration such that under the action of a given potential at the terminals of the diode, the avalanche field is attained solely in the central region.

The invention will be better understood from a consideration of the ensuing description, by reference to the attached drawings in which.

Figure 1:
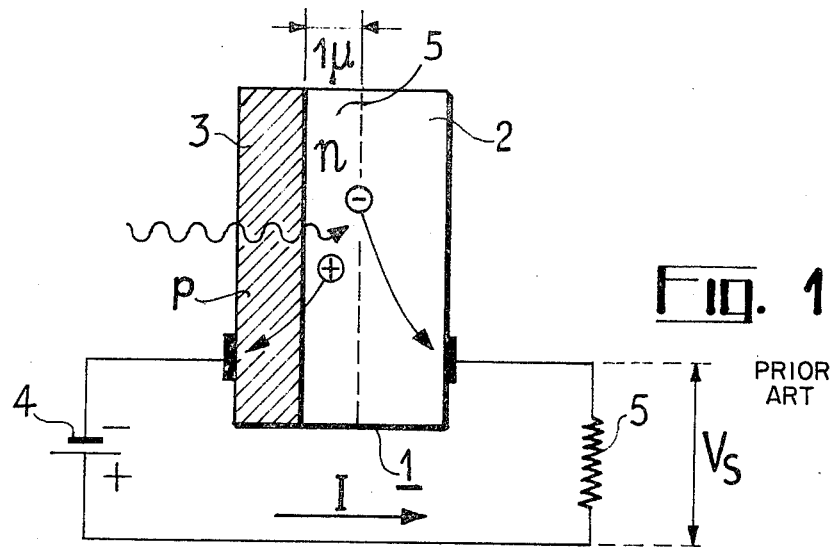
FIG. 1 illustrates the block diagram of a light detector circuit comprising a conventional avalanche diode.

In FIG. 1, there can be seen a heterojunction diode 1 with a substrate 2 made of gallium arsenide, GaAs of n-type. Upon the substrate, a layer 3 of p-type has been deposited, this layer having a composition $Ga_{1-x} Al_x As$ where $0.2 < x < 1$.

The diode is reverse-biased by a battery 4 and the signal produced is picked off across the two terminals of a load resistor 5 connected between the + pole of the battery and a contact on the surface of the region 2.

The surface of the region 3 receives radiation, vis-a-vis which is transparent, that is to say whose wavelength is of the order of 0.8 microns. A problem arises if it is desired to operate the diode in the avalanche mode. It is necessary that the luminous flux should pass the layer 3 without being unattenuated and that the depletion zone 5, that is to say the zone from which the free charge carriers have been expelled by the reverse-biasing, should be submitted to a sufficiently strong electric field for producing the avalanche phenonemon.

The problem of triggering the avalanche phenonemon simply in the axial portion of the diode arises. At this effect, in the known diodes, means such as guard rings are provided in order to reduce the electric field in the peripheral portion of the diode.

The object of the present invention is a diode in which the electric field, in its axial region, is made stronger so that at a low voltage of the order of 30 volts, the avalanche electric field is achieved in the central region.

Figure 2:
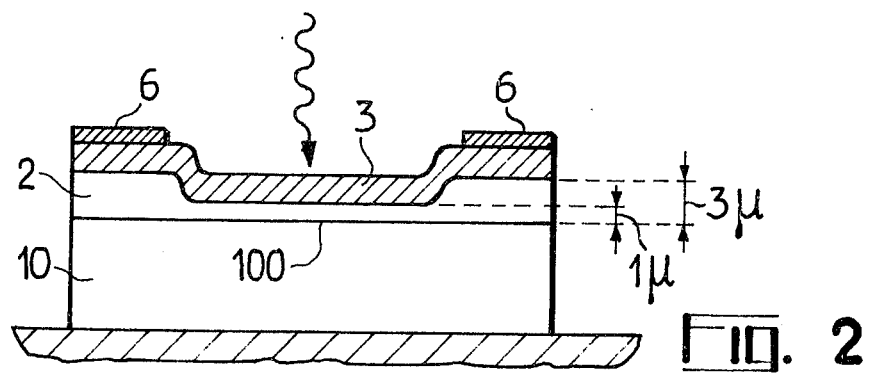
FIGS. 2 to 6 illustrate in transverse section embodiments of the invention.

A first example has been shown in FIG. 2.

In all the figures, similar references designate similar elements.

Upon a substrate 10 of gallium arsenide (GaAs) of n-type, having a donor impurity concentration of the order of $10^{18}$ at/cm$^3$, there is deposited, for example by epitaxy, in the liquid phase in a gallium bath containing GaAs in solution: A layer 2 of intrinsic GaAs of n-type or p-type having a donor or acceptor concentration of less than $10^{17}$ at/cm$^3$, 2 to 10 microns in thickness.

The thickness of this layer is then reduced in the central region 100 where it is desired to produce the avalanche phenonemon, this region being for example a circle 100 microns in diameter, the reduction being effected down to a thickness of 1 to 2 microns. This reduction can be produced by chemical etching in a solution containing essentially peroxide of hydrogen or by ion machining.

This thickness enables the free charge carriers to be totally evacuated from said central zone for a voltage of the order of 10 volts by reverse-biasing the diode.

The technique of epitaxy is well known in the art. Between 850° and 950° C, the gallium bath, in cooling, becomes saturated with gallium arsenide and the latter is deposited upon the substrate.

Then, the wafer is introduced into another bath at a substantially identical temperature, this bath containing aluminum and GaAs in solution. This is done employing the same temperature cycle by passing the wafer through the same oven containing the two baths and for that matter, others if required. Such devices are well known in GaAs technology.

Then, using epitaxy in the liquid phase, a layer 3 having substantially the composition $Ga_{0.8}Al_{0.2}As$ is deposited, this layer being of p-type and having a donor density in excess of $10^{18}$ at/cm$^3$ and a thickness in excess of 1 micron; electrical contacts 6 are formed on the layer. The assembly is mounted in the manner shown in FIG. 1.

The reverse voltage is such that the avalanche field is reached in the region 100 and there only. The number of charges passing through the external circuit is equal to the number of electron-hole pairs created by the radiation multiplied by the avalanche gain M. The electron-hole pairs are, of course, created in the depletion zone 100. In the remainder of the diode, the avalanche field is not reached in the corresponding depletion zone.

In the example described, the avalanche voltage is attained at around 30 volts.

The performance characteristics of an avalanche photo-diode are generally defined by the gain by bandwidth product, by the quantum efficiency as a function of wavelength (number of electron-hole pairs per incident photon) and by the reverse voltage at which avalanche is achieved.

Using the diode of FIG. 2, a product gain by bandwidth product of around 100 Ghz and a quantum efficiency of 0.6 to 0.8 are achieved.

Other embodiments of the invention are possible, without departing from the scope of the invention.

Figure 3:
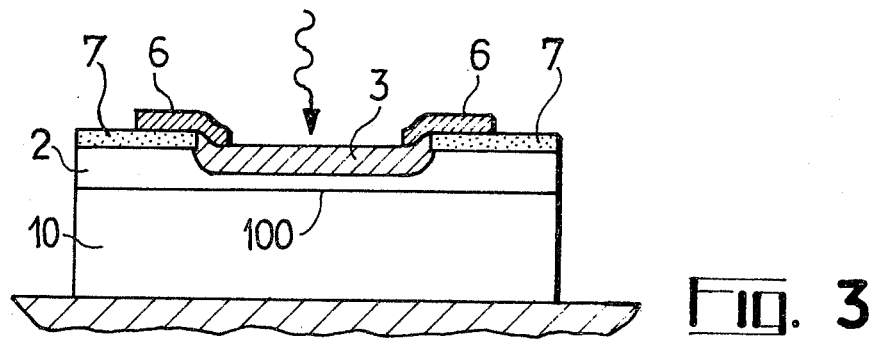

A second example has been shown in FIG. 3. The structure is substantially identical to that of FIG. 2.

The layer 2 has its thickness reduced in the region 100, by partial dissolving of said layer in the gallium bath, prior to the epitaxial deposition of the layer 3. To this end, the peripheral portion is protected by an insulating ($SiO_2$ or $Si_3N_4$ for example) layer 7 the central part of which has been removed by conventional methods (photo-etching, electronic masking &c).

Figure 4:
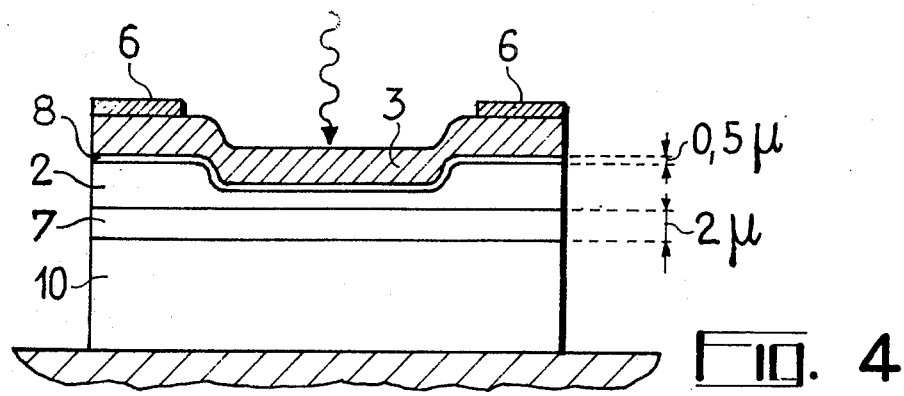

In FIG. 4, the diode illustrated is distinguished from that of FIG. 2 by the presence of a supplementary epitaxial layer 7 between the layer 10 and the layer 2.

The layer 7 is of N-type, with a donor concentration in excess of $10^{18}$ at/.cm$^3$. It may be of superior crystalline quality than that of the substrate.

Moreover, a layer 8 of GaAs, 0.5 microns thick, is arranged between the layers 3 and 2.

In this layer, which is of n-type and more highly doped than the layer 3, the electric field will be stronger and the avalanche will start there. The layer 3 will continue to play the part of detector layer.

Figure 5:
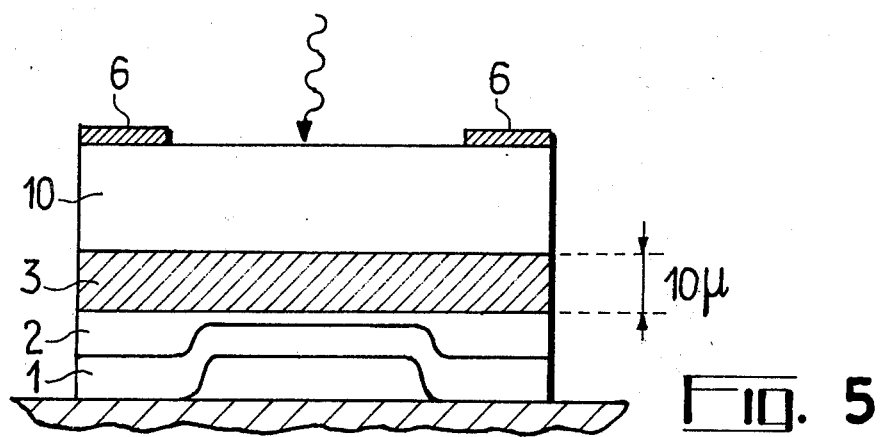

In FIG. 5, the substrate 10 of gallium phosphide is transparent at the wavelength to be detected, and is exposed to the radiation. On this substrate there are deposited the layer 3 made of Ga, Al, As, and of n-type, and the layer 2 of weakly doped or intrinsic GaAs where the avalanche will develop, and the layer 1 of GaAs which is p-type with a concentration of $10^{18}$ At/cm$^3$.

Figure 6:
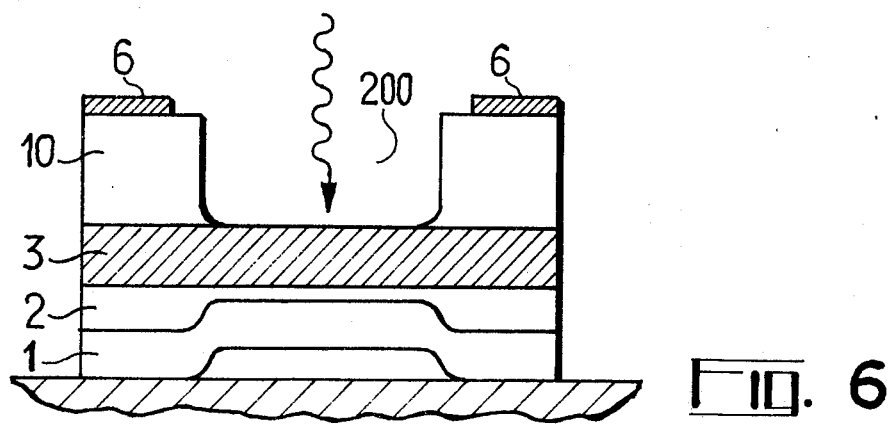

In FIG. 6, the GaAs substrate 10 is not transparent. It is hollowed out at its central zone 200 to bare the transparent zone 3.

The remainder of the structure is identical to that shown in FIG. 2.

Without departing from the scope of the invention it is possible to use other semiconductor materials, for example compounds of the elements of columns III and V of the MENDELIAN classification, for example Ga, As, P compounds or again Ga, In, As, compunds.

What I claim is;

1. A heterojunction avalanche photodiode comprising superimposed in succession: a first semiconductor region of a first conductivity type for receiving the radiation which is to be detected and transparent to said radiation, a second, weakly-doped region which is opaque to said radiation, a third region of a second conductivity type opposite to the first conductivity type, and respective contacts on said first and third regions for connecting this contact to a d.c supply in order to reverse-bias said diode, said second region having a zone in which its thickness is substantially thinner than at the location where said contact is deposited, so that the avalanche electric field is achieved selectively in said zone at applied voltages occurring within a given range.

2. A photodiode as claimed in claim 1, having the shape of a solid of revolution; said zone being the axial zone of said second region, the respective contacts being deposited upon the peripheral zone of said regions.

3. A diode as claimed in claim 2, wherein said transparent region is made of a compound of gallium, arsenic and aluminum having the formula AsGa$_{1-x}$Al$_x$ where $0.2<x<1$ and said second region is made of gallium arsenide.

4. A diode as claimed in claim 3 comprising a substrate said transparent region being capable of being directly exposed to radiation impact and said second opaque region being deposited upon said substrate.

5. A diode as claimed in claim 3, wherein a substrate carries said transparent region, said substrate being transparent to said radiation.

6. A diode as claimed in claim 3, wherein a substrate carries said transparent layer, said substrate having an axial recess baring a portion of said transparent layer.

7. A diode as claimed in claim 3, wherein said opaque region comprises two superimposed portions, one of which is more highly doped.

* * * * *